United States Patent [19]

McEwen et al.

[11] Patent Number: 4,891,246
[45] Date of Patent: Jan. 2, 1990

[54] CONTROLLED ATMOSPHERE FIRING PROCESS

[75] Inventors: Craig S. McEwen; Noel C. Scrivner, both of Wilmington, Del.

[73] Assignee: E. I. Du Pont De Nemours and Company, Wilmington, Del.

[21] Appl. No.: 235,273

[22] Filed: Aug. 23, 1988

Related U.S. Application Data

[63] Continuation-in-part of Ser. No. 918,303, Oct. 14, 1986, abandoned.

[51] Int. Cl.$^4$ .............................................. B05D 3/02
[52] U.S. Cl. ...................................... 427/229; 427/96
[58] Field of Search .................... 427/229, 96, 383.5, 427/374.7

[56] References Cited

U.S. PATENT DOCUMENTS

| 2,547,149 | 4/1951 | Beaudet | 427/334.7 |
| 3,801,363 | 4/1974 | Buck | 427/383.5 |
| 4,341,820 | 7/1982 | Taylor et al. | 427/226 |

Primary Examiner—Thurman K. Page
Assistant Examiner—Leon R. Horns

[57] ABSTRACT

A process for firing oxidizable base metals in the presence of organic media in the presence of $CO/CO_2$ and water to avoid oxidation of the base metal.

18 Claims, 2 Drawing Sheets 4,891,246

CONTROLLED ATMOSPHERE FIRING PROCESS

CROSS REFERENCE TO RELATED APPLICATION

This application is a continuation-in-part of copending U.S. patent application Ser. No. 06/918,303, filed Oct. 14, 1986, now abandoned.

FIELD OF THE INVENTION

The invention is directed to a process for firing oxidizable base metals in a controlled atmosphere to avoid oxidation of the base metal.

BACKGROUND OF THE INVENTION

Multilayer circuits containing base metal conductors interleaved with insulating dielectric layers are made from base metal and ceramic powders, both mixed with organic binders and other organic constituents. When fired, the organic constituents must be removed while the metal must be retained in its unoxidized state.

Multilayer base metal circuits are conventionally fired one layer at a time in a nitrogen atmosphere containing up to a few hundred ppm $O_2$ to remove the organics. The metal oxide and not the metal in its elemental form if usually thermodynamically stable under these conditions. However, the rate of oxidation of the metal is usually low, especially in the relatively reducing environment creaated by the organic decomposition products. After the metal powder has sintered oxidation requires diffusion of the oxygen through the metal oxide layer to the bulk metal. Most of the $O_2$ in the $N_2$ atmosphere is added at lower temperatures where the diffusion rate through the metal oxide layer into the metal is relatively low. Sintering, then, partially protects the metal from oxidation when the next layer is fired on top of it.

However, a certain amount of oxidation is typical, especially when using organics that require high $O_2$ concentrations in the firing atmosphere for removal. Firing in an $O_2/N_2$ atmosphere often results in discoloration of the dielectric layer when over metal because of diffusion of metal ions and precipitation of metal atoms in the dielectric. The amount of metal oxidation and dielectric discoloration depend on the level of $O_2$ used which in turn dependsd on both the quantity and nature of the organics present. In general, low levels of $O_2$ give low metal oxidation but high dielectric discoloration, while high levels of $O_2$ give low dielectric discoloration but high oxidation. Optimizing the $O_2$ level under these circumstances is often difficult.

Cofiring, or simultaneous firing, of dielectric and metal layer in an $O_2/N_2$ atmosphere is even more difficult than firing the layers one at a time because longer times are required to remove the organics and since the metal layers have not been previously sintered they have little protection against this oxidizing atmosphere.

PRIOR ART

The extensive use and wide variety of controlled firing atmospheres is illustrated by the following prior art publications.

U.S. Pat. No. 2,547,149, Beaudet

The patent is directed to a method of firing porcelain in which the organic content of biscuit paste is burned off in a reducing atmosphere of $CO/CO_2$ and $H_2O$.

U.S. Pat. No. 3,183,588, Mathieu

Copper-alloy clad vessels are processed in a neutral or reducing atmosphere to avoid oxidation of the copper.

U.S. Pat. No. 3,009,886, Wejnarth

Silicon carbide-containing resistor compositions are sintered in a reactive hydrocarbonaceous gas at 2200°–2450° C.

U.S. Pat. No. 3,423,517, Arrhenius

This patent is directed to monolithic ceramic electrical interconnecting structures which are fired in a reducing atmosphere such as argon containing 10% $H_2$.

U.S. Pat. No. 3,615,980, Schuck et al.

The patent is directed to the decal metallization of ceramic substrates in which the decal is fired in two steps. In the first, the decal is fired in an oxidizing atmosphere to burn off the decal binder and in the second the substrate is fired in a reducing atmosphere of $H_2$ and $H_2O$ and $H_2$ and $N_2$ to effect bonding of the metal to the substrate.

U.S. Pat. No. 3,770,529, Anderson

The patent is directed to multilayer ceramic circuit structures made from green sheets in which the binder is burned off in either air or a reducing atmosphere.

U.S. Pat. No. 3,852,877, Ahn et al.

The patent is directed to making multilayer ceramic circuit structures from green sheets in which the binder is burned off in a reducing atmosphere of $H_2$ and $H_2O$.

U.S. Pat. No. 4,089,813, Alexander

The patent discloses firing $BaTiO_3$-based dielectrics in an atmosphere of $N_2$ and optionally either 2–10 mole % $H_2O$ or $H_2/CO_2$.

U.S. Pat. No. 4,097,911, Dorrian

The patent is directed to a method of making monolithic ceramic capacitors in which the electrodes are fired at 2500° C. in a low oxygen atmosphere comprising $CO_2$ and $CO$.

U.S. Pat. No. 4,101,952, Burn

The reference is directed to monolithic ceramic capacitors which are sintered at 950°–1080° C. in a $C_2/CO$ atmosphere to avoid oxidation of the electrode metals.

U.S. Pat. No. 4,234,367, Herron et al.

The patent discloses the firing of multilayer interconnected thick film circuits having copper conductors in an atmosphere of $H_2/H_2O$.

U.S. Pat. No. 4,504,339, Kamehara et al.

The patent discloses firing multilayered glass-ceramic structures having copper-based patterns in which firing is carried out in two steps. In the first step the binder is volatilized in an atmosphere of inert gas ($N_2$, Ar, He) and $H_2O$ and the sintering is carried out in inert gas without water.

U.S. Pat. No. 4,551,357, Takeuchi

The reference is directed to a method of cofiring dielectric and base metal conductor pastes in which the organic medium of the conductor paste has a higher decomposition temperature than the binder in the dielectric paste. The cofiring is carried out in two steps: (1) an oxidizing step to decompose the binder without decomposing the organic medium and (2) a low oxygen atmosphere step to decompose the organic medium. An atmosphere of $H_2+N_2+H_2O$ is disclosed as a suitable atmosphere for decomposing the organic medium.

Hotchkiss et al., Protective Furnace Atmospheres, Metals Handbook, 1984 Edition

This publication contains a general discussion of protective firing atmospheres and their function is annealing ferrous metals. Partly burned fuel gas is disclosed which presumably is saturated with water of combustion but also contains large amounts of $N_2$ (68.5 mole %). Other protective atmospheres discussed are hydrogen, dissociated ammonia, completely burned fuel gas and reacted fuel gas.

SUMMARY OF THE INVENTION

In its primary aspect the invention is directed to a process for firing an oxidizable base metal in the presence of an organic medium to effect volatilization of the organic medium without substantial oxidation of the metal. The process comprises heating the metal and organic medium in an atmosphere consisting essentially of CO, $CO_2$ and from 0.1 to 90 mole % $H_2O$ basis $CO_2$, to a temperature above the thermal decomposition temperature of the organic medium and below the melting point of the base metal between the metal/metal oxide and carbon/carbon oxides phase transition lines of the resultant mixture of the atmosphere with gaseous products from decomposition of the organic medium for a time sufficient to burn out essentially all of the organic medium.

In a second aspect, the invention is directed to the above-described process in which the base metal is comprised of an admixture of first and second base metals having lower and higher metal/metal oxide phasae transition lines respectively and the firing temperature is between the metal/metal oxide transition lines of the base metals by which the first metal undergoes no substantial oxidation and the second metal undergoes essentially complete oxidation.

BRIEF DESCRIPTION OF THE DRAWING

The drawing consists of two figures of which both In FIG. 1, the effect of $H_2O$ addition is shown and in FIG. 2, lines of constant $O_2$ partial pressure are superimposed.

DETAILED DESCRIPTION OF THE INVENTION

Figure 1:
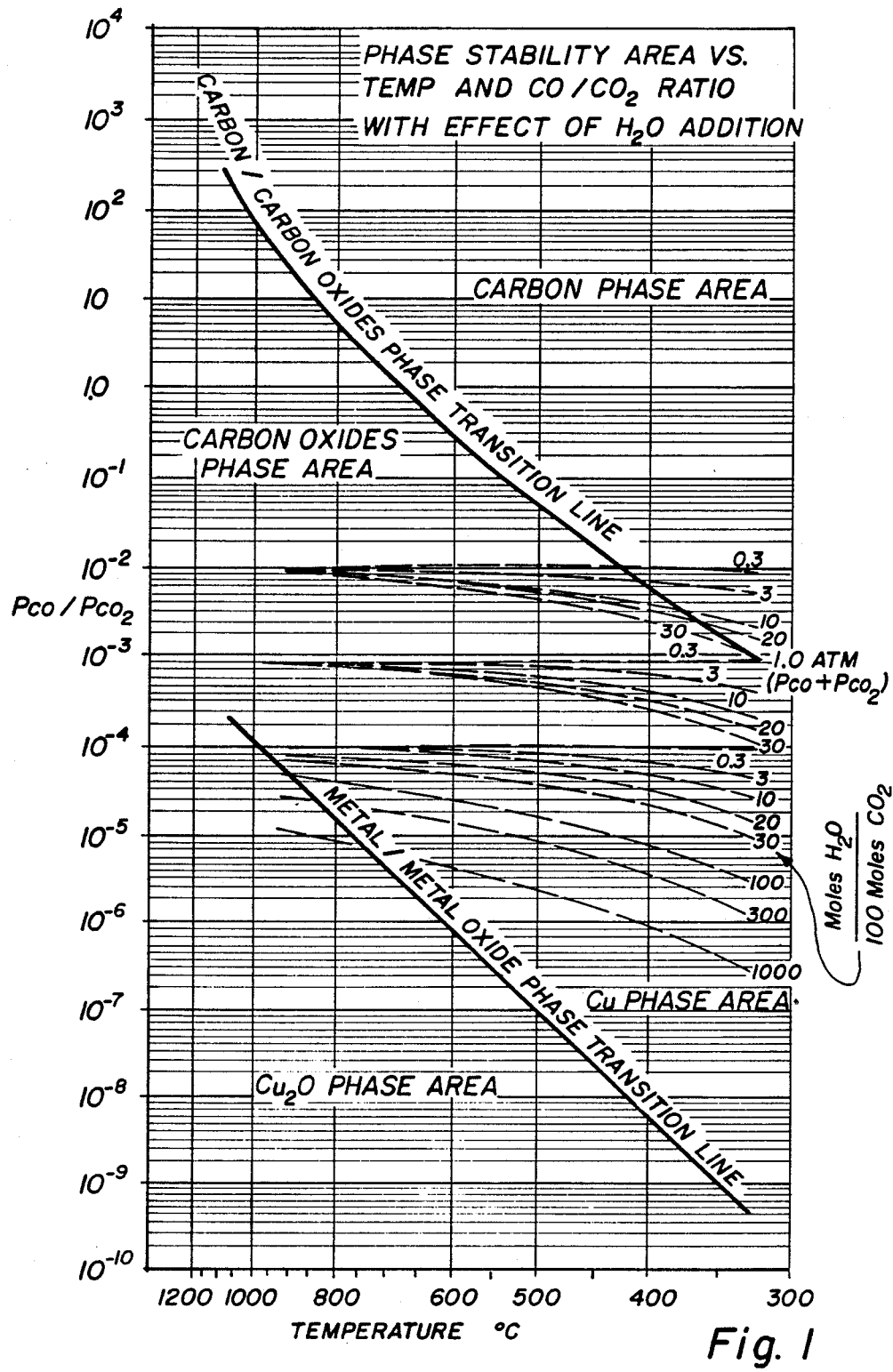
FIG. 1 and FIG. 2 are graphical representations of the phase stability area of metallic copper in an atmosphere of $CO/CO_2$ as a function of firing temperature and the ratio of the partial pressures of CO to $CO_2$.
Figure 2:
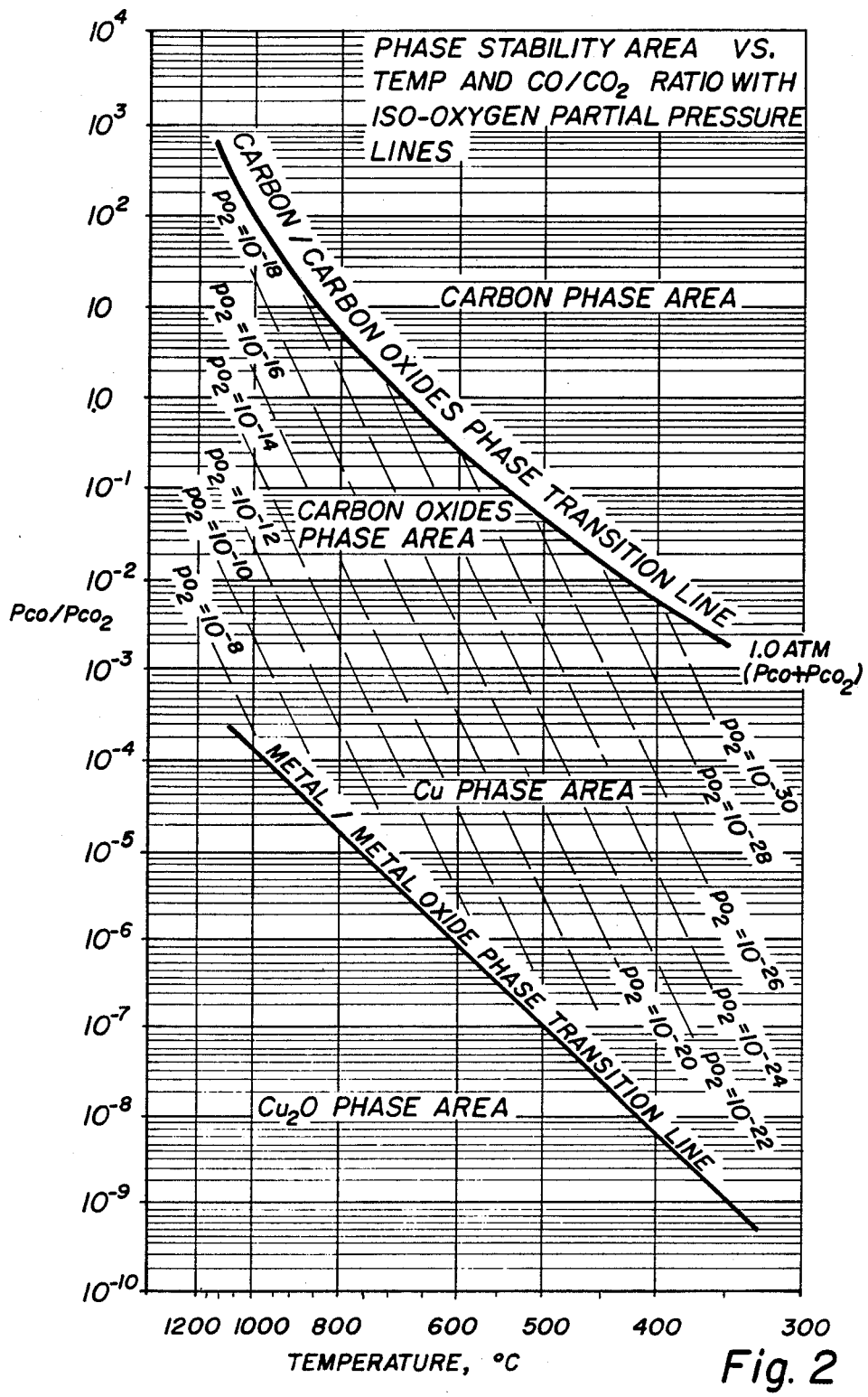

Firing in $O_2/N_2$ as described above is a kinetically-controlled process. That is, conditions are chosen that maximize the rate of carbon oxidation and minimize rates of metal oxidation, diffusion, and precipitation. Another approach is to use a thermodynamically-controlled process in which undesirable reaction rates are set to zero by choosing conditions under which the changes in the free energies of the undesirable reactions are positive. A $CO/CO_2$ atmosphere functions thermodynamically by controlling oxygen partial pressure. With the appropriate $CO/CO_2$ ratio, organics can be removed from the metal and dielectric layers with no metal oxidation or dielectric discoloration. There is no theoretical limit to the number of layers that can be cofired. In practice, however, relatively long times are required to remove the organics using this firing atmosphere.

Adding water to the atmosphere substantially alters the rate of organic removal without significantly changing the thermodynamic conditions preventing metal oxidation of dielectric discoloration. In short, while $CO/CO_2$ by itself is sufficient for cofiring ceramic multilayers the addition of water makes the process a practical one.

The amount of water to be added to the $CO/CO_2$ atmosphere is not itself narrowly critical. As little as 0.1 mole % water is beneficial and as much as 90 mole % $H_2O$ does not appear to be detrimental. However, no further benefit of $H_2O$ addition is apparent beyond about 30 mole % $H_2O$ addition. Moreover, $H_2O$ additions above that 5% yield only slight increases in firing rates. Thus, $H_2O$ additions of 0.1-5 mole % are preferred and, at least for copper, about 3% appears to be optimum.

The firing atmosphere for use in the invention are conveniently prepared by admixing CO and $CO_2$ gases in the desired proportions and then bubbling the admixture of gases through water in order to humidify the gases to the desired level. When using this method to add water to the $CO/CO_2$ mixture, the temperature of the water can be raised or lowered to increase or reduce the amount of water addition. When the water is added at room temperature (about 20° C.), the addition of water to the $CO/CO_2$ admixture is approximately 3 mole %.

It will be recognized that the process of the invention is applicable to a wide variety of oxidizable base metal so long as their metal/metal oxide phase transition lines in a $CO/CO_2$ atmosphere lie below the carbon/carbon oxides phase transition line. The base metal is usually present in the form of finely divided particles dispersed in an organic medium. Suitable metals include Cu, Ni and Mo, the last only above about 700° C. However oxidizable base metals such as Ti and W are not suitable for use in the invention process because their metal/metal oxide phase transition lines lie above the carbon/carbon oxides phase transition line of $CO/CO_2$ atmospheres and thus the $CO/CO_2$ atmosphere itself will precipitate carbon under these conditions.

It will further be recognized that the process of the invention is applicable to any organic medium which is volatilizable and has a thermal decomposition temperature below the melting point of the base metal. The main purpose of the organic medium is to serve as a vehicle for the application of finely divided base metals or other electrically functional material to a ceramic or other substrate. Examples of suitable organic media are disclosed in U.S. Pat. No. 4,613,560 to Dueber et al. and copending U.S. patent application Ser. No. 07/146,541 by Dorfman et al., filed Jan. 21, 1988, both of which are incorporated herein by reference. These organic media may include organic polymeric binders such as acrylic polymers, organic plasticizers such as phthalic acid esters and acetic acid esters, photohardenable organic monomers such as addition polymerizable ethylenically unsaturated compounds having at least one polymerizable ethylenic group, and organic photoinitiataors such as quinones, vicinal ketaldonyl alcohols, acyloin ethers, aromatic acyloins, benzophenones and Michler's ketone. Other materials which may optionally be included in the organic medium include antioxidants, dispersing agents, wetting agents, stripping agents, adhesion promoters, coating aids, release agents, antifouling agents, pigments, dyes, thermal polymerization inhibitors, sensitizers, and resolution and exposure latitude improvers.

The organic meddium may be a solid matrix of organic polymer or an inert organic liquid solvent, such as a terpene, may be added to form a liquid medium. Examples of preferred media are disclosed in Example 5 of Ser. No. 07/146,541 by Dorfman et al. and in Example 14 of U.S. Pat. No. No. 4,613,560 by Dueber et al. The organic medium in Example 5 of Ser. No. 07/146,541 is composed of a copolymer of methyl methacrylate with methacrylic acid, a methyl methacrylate homopolymer, a copolymer of methyl methacrylate with gamma-methacryloxylpropyltrimethoxy silane, polyoxyethylated trimethylolpropane triacrylate, benzophenone, Michler's ketone and tetraethylene glyco diacetate. The organic medium in Example 14 of U.S. Pat. No. 4,613,560 is composed of a copolymer of methylmethacrylate with ethyl acrylate, polyoxyethylated trimethylolpropane triacrylate, dibutyl phthalate, benzyl isooctyl phthalate, Michler's ketone, benzophenone, di-t-butylnitrosomethane dimer, 2,6-di-t-butyl-4-methylphenol, and polyethylene oxide.

The process of the invention can be used to fire liquid dispersions, thick film pastes or solid films such as green tapes or dry films. Also when firing sequentially the process can be used to prevent the oxidation of already formed oxidizable metal layers adjacent to layers of other electrically functional material dispersions in organic medium. Furthermore, it will be recognized that the process can be used in the manufacture of multilayer electronic elements such as multilayer interconnects, whether they are fired sequentially, semisequentially or cofired. The terms "electric functionality" and "electrically functional" refer to materials—either inorganic or organic—which when appropriately processed have conductive, resistive, or dielective functionality.

In each case it is necessary that the firing temperature be above the decomposition temperature of the organic medium in which the base metal is dispersed, but below the melting point of the base metal. The volatilization process, that is, the process of removing organic media during firing occurs in three steps: first, evaporation of lower molecular components; second, nonoxidative pyrolysis of heavier materials; and third, oxidation of the remaining materials. Thus, for most organic media the firing temperature for the process must be at least about 350° to 400° C. and can, of course, be much higher to obtain more rapid and complete volatilization. As used herein the term "volatilization" means substantially complete removal of the organic medium which would normally take place as mentioned above by a combination of evaporation, oxidation and pyrolysis depending, inter alia, on the composition of the organic medium in which the base metal is dispersed.

On the other hand, the process of the invention must be carried out below the melting point of the base metal. Preferably the process is carried out at a temperature at least 50° C. below the melting point of the base metal being fired. For example, in firing copper which has a melting point of 1083° C. the firing temperature will normally fall within the range of 900°-1025° C.

One of the advantages of the $CO/CO_2$ firing atmosphere is that it is an equilibrium-related or "buffered" system in which the $O_2$ concentration is fixed easily by adjusting the $CO/CO_2$ ratio. Thus the oxidation reduction potential of the gas admixture is easily established by adjusting the $CO/CO_2$. (As used herein the term "oxidation/reduction potential" means the tendency of the atmosphere under defining conditions either to oxidize or reduce other materials.)

In most instances it will be preferred to utilize a controlled atmosphere of $CO/CO_2$ and $H_2O$ alone so that the volume of gases which must be passed through the firing furnace can be minimized. Nevertheless it is quite feasible to use inert gas diluents in the $CO/CO_2$ and $H_2O$ atmosphere such as $N_2$ and argon. Such inert gases in some instances be used to minimize undesirable reactions in the system after the organic medium is completely removed. It will, of course, be realized by those skilled in the art that the oxidation/reduction potential of the $CO/CO_2$ atmosphere might also be expressed in terms of $O_2$ content. However, $CO/CO_2$ ratio is a more convenient expression for the oxidation/reduction potential since the term incorporates both of the process variables which are used directly to adjust the oxidation/reduction potential.

An advantage of the invention process is that it utilizes a high partial pressure of $CO_2$ (relative to $O_2$) which is the source of the oxidizing species of the $CO/CO_2$ system. The significance of this is that the diffusion transfer rate of $CO_2$ into the substrate is quite high and therefore volatilization is more complete in a given period of time. Concomitantly the $CO/CO_2$ system also has a high concentration of CO, the reducing species, which gives a high diffusion transfer rate of CO and thus maintains the base metal in the nonoxidized (bright) state. Furthermore, because the oxidative reaction of $CO_2$ is endothermic, the system is very unlikely to incur localized runaway reactions which can cause hot spots which in turn lead to unwanted entrapment of organic materials and other unwanted effects such as melting the base metal.

Turning now to FIG. 1 of the drawing, it can be seen that the addition of $H_2O$ to the $CO/CO_2$ atmosphere at any given temperature results in a slight lowering of the ratio of the partial pressure of CO to $CO_2$. Furthermore, the lower the temperature the greater this lowering effect becomes. However, the amount of additional $O_2$ added to the firing atmosphere by this addition is not significant which can be seen in the following examples which show that a higher level of $H_2O$ addition and the concomitantly higher oxidation potential do not thermodynamically contribute to better burnout characteristics.

TEST PROCEDURES—INK ADSORPTION

The Ink Adsorption Test is a qualitative test for estimating the degree of dielectric porosity, and thus provides a rough measure of the completeness of organic removal. The test is carried out as follows. The test piece is held horizontally. A drop of nonsmear rubber-stamp blue ink (Ranger Products Company, Red Bank, NJ) is placed on the dielectric surface and allowed to stand 30 seconds. The test part is then held vertically in a stream of cold tap water for 30 seconds, followed by a stream of acetone for 15 seconds, in the attempt to wash off the ink. Areas of ink retention which are traceable to distinct defects, such as blisters or dirt, should be ignored. If there is no visible ink retention on the dielectric surface, the dielectric is deemed nonporous. If there is visible ink retention on the dielectric surface, the dielectric is deemed porous.

EXAMPLES

In the following examples, the solid film of copper dispersed in organic medium used as described in Example 5 of copending patent application Ser. No. 07/146,541 filed Jan. 21, 1988 and the solid film of dielectric material dispersed in photosensitive organic medium used is described in Example 14 of U.S. Pat. No. 4,613,560.

EXAMPLES 1–7

A series of seven tests was performed to observe the relative efficacy of several controlled firing atmospheres under prolonged firing times which approached equilibrium conversion levels. In each test, a solid film of copper dispersed in a photosensitive organic polymer medium and a solid film of dielectric material dispersed in a photosensitive organic polymer medium were laminated to 2.5×2.5 cm $Al_2O_3$ substrate squares and exposed to harden the laminated film layer. Several of these elements were then fired in each of the controlled atmospheres. The firing profile for this series of tests was two hours from room temperature to 650° C., 16 hours at 650° C. and then slow cooldown by turning the furnace off.

The results of these tests are given in Table 1 below:

TABLE 1
Comparison of Firing Copper and Dielectric Elements in Various Controlled Atmospheres

| Ex. No. | Controlled Atmosphere Composition (% vol.) | Characteristics of Fired Elements |
|---|---|---|
| 1 | $N_2$ (high purity) 100 | Both elements covered with grey residue layer indicating inadequate removal of organics resulting from insufficient $O_2$ |
| 2 | $N_2/H_2O$ 97/3 | Dielectric layer clean and copper layer completely oxidized indicating excessive $O_2$ |
| 3 | $N_2/O_2$ 100/~0 (100 ppm) | Dielectric layer clean and copper layer completely oxidized indicating excessive $O_2$ |
| 4 | $CO_2$ 100 | Dielectric layer clean and copper layer completely oxidized indicating excessive $O_2$ |
| 5 | $CO/CO_2$ 0.01/~100 | Dielectric layer clean and copper layer completely oxidized indicating excessive $O_2$ |
| 6 | $CO/CO_2$ 1/99 | Dielectric layer clean and copper layer bright indicating complete removal of organics without oxidation of the Cu metal. |
| 7 | $CO/CO_2/H_2O$ 1/96/3 | Dielectric layer clean and copper layer bright indicating complete removal of organics without oxidation of the Cu metal. |

The results in Table 1 show that high-purity $N_2$ by itself has insufficient $O_2$ to volatilize the organic medium adequately. On the other hand, the addition of a small amount of $H_2O$ as an $O_2$ source gave adequate volatilization of the organic medium, but substantially completely oxidized the copper. The same result was obtained when only 100 ppm $O_2$ was added to the $N_2$. Likewise, $CO_2$ by itself gave thorough burnout (volatilization) of the medium, but over-oxidized the copper. This same effect can still be seen when 0.01% volume CO was added to the $CO_2$. This was not expected thermodynamically but is believed to have been caused by oxygen intrusion into the system. However, Examples 6 and 7 both show that when enough CO is added to the $CO_2$ the reduction potential of the gaseous mixture is sufficient completely to protect the copper from oxidation. In comparing Examples 6 and 7 there was no apparent difference in the effectiveness of $CO/CO_2$ and $CO/CO_2/H_2O$ at equilibrium. This is of course because of the long firing time used in the three tests. However, as can be seen from Examples 8 and 9 below, the addition of water has a dramatic effect in speeding up the volatilization process without altering in any significant way the favorable thermodynamics of the underlying $CO/CO_2$ atmosphere.

EXAMPLES 8 and 9

A further test was performed in the same manner as Examples 6 and 7 in which atmospheres of $CO/CO_2$ 1/99 and $CO/CO_2/H_2O$ 1/96/3 (by volume) were used. The firing profile for these tests was one hour from room temperature to 650° C., 4 hours at 650° C. and then slow cooldown by turning the furnace off.

The copper surfaces in both tests were shiny. However, from the fact that the dielectric was dirty with the use of $CO/CO_2$ alone but clearly white with $CO/CO_2/H_2O$, it was apparent that complete burnout of organic medium was accomplished more rapidly by the addition of $H_2O$ to the firing atmosphere.

EXAMPLES 10–13

To observe the effect of various levels of $H_2O$ addition on the volatilization of organic media, a series of tests was run in which $H_2O$ addition was varied from 0 to 30 vol. %, with the same materials fired under otherwise identical conditions.

In each test, a solid film of copper dispersed in a photosensitive organic medium and a solid film of dielectric material dispersed in a photosensitive organic polymer medium were laminated to 2.5×2.5 cm $Al_2O_3$ substrate squares and exposed to harden the laminated film layer. Several of these laminated elements were then fired in $CO/CO_2$ atmospheres containing various levels of $H_2O$ using a firing profile of two hours from room temperature to 650° C. and one hour dwell time at 650° C. before turning off the furnace to effect a slow cooldown. The results of these tests are given in Table 2 below.

TABLE 2

Effect of H$_2$O Addition Level on Firing in CO/CO$_2$ Atmospheres

| Ex. No. | Water Bath Temperatures (°C.) | CO/CO$_2$/H$_2$O Proportions (% vol.) | Characteristics of the Fired Elements |
|---|---|---|---|
| 10 | — | 1/99/0 | Grey residue covering entire surface of both elements |
| 11 | 20 | 1/96/3 | Lighter colored grey residue incompletely covering surfaces of both elements |
| 12 | 47 | 1/89/10 | Lighter colored grey residue incompletely covering surfaces of both elements |
| 13 | 69 | 1/69/30 | Light colored grey residue as in Examples 9 and 10 very slightly less area covered by residue. |

These results show that at the short firing times used in this series of tests, the addition of 3% H$_2$O to the CO/CO$_2$ atmosphere gave substantially better burnout of organics from both the copper and the dielectric. The data also show that the addition of higher amounts of H$_2$O, while not deleterious, is nevertheless not required. Though the copper surfaces were not yet shiny at these conditions, it is evident that somewhat longer firing times would yield sufficiently better burnout to obtain a completely nonoxidized copper surface.

EXAMPLE 14

This example illustrates the use of the firing process of the invention in the manufacture of multilayer composite elements consisting of four copper layers alternating with three dielectric layers supported on an alumina substrate. The same conductor and dielectric materials were used as in the other Examples.

A layer of copper film dispersion was laminated to the alumina substrate and a layer of the dielectric film as laminated to the copper film and the composite structure as fired in an atmosphere of CO/CO$_2$/H$_2$O 1/96/3. The firing profile was 5° per minute from room temperature to 650° C., about 16 hours at 650° C., 5° per minute up to 900° C. and 10 minutes dwell time at 900° C. before turning off the furnace to effect slow cooldown.

This sequence of applying two functional layers and firing was repeated three times and then a final copper layer was added by the same method. Thus, the eight-layer (including the substrate) device was made in four firing steps. The finished device had no interlayer shorts or line breaks, had no detectable stain and was hermetic as measured by the Ink Adsorption Test described hereinabove.

EXAMPLE 15

This Example again illustrates the use of the firing process of the invention in the manufacture of multilayer composite elements as in Example 14. However, in this Example, the structure was made with only two firings. For the first firing, a composite supported on alumina was built up by lamination on the alumina substrate of two layers each of copper and the dielectric (DE) films in the sequence Cu/DE/Cu/DE and firing the five layered laminate. For the second firing, three further layers were laminated atop the exposed dielectric layer of the first fired laminated structure in the sequence Cu/DE/Cu and the entire eight layer structure was cofired. Again, the finished device had no interlayer shorts, had no interlayer stain and was hermetic as measured by the Ink Adsorption Test.

Examples 14 and 15 along with the other examples show clearly that the controlled atmospheric firing process of the invention can be used both for sequential and cofiring of multicomponent electrically functional structures.

We claim:

1. A process for firing an oxidizable base metal in the presence of a volatilizable organic medium to effect volatilization of the organic medium without substantial oxidation of the metal comprising heating the metal and the organic medium in an atmosphere consisting essentially of CO, CO$_2$ and from 0.1 to 90 mole % H$_2$O basis CO$_2$, to a temperature above the thermal decomposition temperature of the organic medium and below the melting point of the base metal between the metal/metal oxide and carbon/carbon oxides phase transition lines of the resultant mixture of the atmospheres with gaseous products from decomposition of the organic medium for a time sufficient to volatilize the organic medium therefrom.

2. The process of claim 1 in which finely divided particles of the oxidizable base metal are dispersed in the organic medium.

3. The process of claim 1 in which the base metal is Cu.

4. The process of claim 2 in which the organic medium is a solid matrix of organic polymer.

5. The process of claim 2 in which the organic medium is a liquid and the dispersion is of paste consistency.

6. The process of claim 2 in which the base metal is comprised of first and second base metals having lower and higher metal/metal oxide phase transition lines respectively and the firing temperature is between the metal/metal oxide transition lines of the base metals by which the first metal undergoes no substantial oxidation and the second metal undergoes essentially complete oxidation.

7. The process of claim 6 in which the oxide of the second metal is a glass former.

8. The process of claim 2 in which the particles of oxidizable base metal are in admixture with particles of glass frit.

9. The process of claim 8 in which the glass is comprised substantially of oxides which are nonreducible at the firing conditions.

10. The process of claim 6 in which the base metal is an admixture of particles of first and second base metals.

11. The process of claim 6 in which the base metal is an alloy of first and second base metals.

12. The process of claim 1 in which the oxidizable base metal is in the form of a previously fired layer adjacent to a layer of finely divided particle of electrically functional inorganic materials dispersed in organic medium.

13. The process of claim 2 in which the oxidizable metal is contained in a multilayer composite element comprising a plurality of layers of oxidizable base metal dispersion alternating with layers of finely divided particles of materials having other electric functionality dispersed in organic medium and the layers are cofired.

14. The process of claim 2 in which a layer of the element is supported on an inorganic dielectric substrate.

15. The process of claim 14 in which the substrate is alumina.

16. The process of claim 2 in which at least one layer of oxidizable metal dispersion is adjacent to a layer of finely divided particles of dielectric materials dispersed in organic medium and the layers are cofired.

17. The process of claim 2 in which at least one layer of oxidizable metal dispersion is sandwiched between layers of finely divided particles of dielectric material dispersed in organic medium and the layers are cofired.

18. The process of claim 2 in which a layer of finely divided dielectric material dispersed in organic medium is sandwiched between layers of oxidizable metal dispersion.

* * * * *